(12) United States Patent
Hada et al.

(10) Patent No.: US 7,592,123 B2
(45) Date of Patent: Sep. 22, 2009

(54) RESIN FOR PHOTORESIST COMPOSITION, PHOTORESIST COMPOSITION AND METHOD FOR FORMING RESIST PATTERN

(75) Inventors: Hideo Hada, Kanagawa-ken (JP); Masaru Takeshita, Kanagawa-ken (JP); Shogo Matsumaru, Kanagawa-ken (JP); Hiroaki Shimizu, Kanagawa-ken (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 10/557,694

(22) PCT Filed: Jun. 2, 2004

(86) PCT No.: PCT/JP2004/008004

§ 371 (c)(1), (2), (4) Date: Nov. 22, 2005

(87) PCT Pub. No.: WO2004/108780

PCT Pub. Date: Dec. 16, 2004

(65) Prior Publication Data

US 2007/0065748 A1 Mar. 22, 2007

(30) Foreign Application Priority Data

| Jun. 5, 2003 | (JP) | ............................. 2003-160478 |
| Dec. 25, 2003 | (JP) | ............................. 2003-428853 |
| Mar. 2, 2004 | (JP) | ............................. 2004-057449 |

(51) Int. Cl.
*G03F 7/039* (2006.01)
*G03F 7/028* (2006.01)
*C08F 2/38* (2006.01)

(52) U.S. Cl. ............... 430/270.1; 430/326; 430/908; 430/914; 526/224; 526/78; 526/85

(58) Field of Classification Search ........... 430/270.1, 430/281.1, 287.1, 326, 285.1, 908, 914; 526/78, 526/85, 224, 319, 328, 328.5
See application file for complete search history.

(56) References Cited

U.S. PATENT DOCUMENTS

| 5,554,664 | A | * | 9/1996 | Lamanna et al. ............... 522/25 |
| 5,968,713 | A | | 10/1999 | Nozaki et al. |
| 6,008,265 | A | | 12/1999 | Vallee et al. |
| 6,239,231 | B1 | | 5/2001 | Fujishima et al. |
| 6,344,304 | B1 | | 2/2002 | Takechi et al. |
| 6,348,297 | B1 | | 2/2002 | Uetani et al. |
| 6,358,665 | B1 | * | 3/2002 | Pawlowski et al. ....... 430/270.1 |
| 6,423,799 | B1 | * | 7/2002 | Berneth et al. ............ 526/218.1 |
| 6,596,458 | B1 | | 7/2003 | Sato et al. |
| 6,656,659 | B1 | | 12/2003 | Nozaki et al. |
| 6,692,889 | B1 | | 2/2004 | Funaki et al. |
| 6,958,206 | B2 | * | 10/2005 | Tsuchimura et al. ..... 430/270.1 |
| 7,220,808 | B2 | * | 5/2007 | Yamagishi et al. .......... 526/212 |

| 2001/0014428 | A1 | | 8/2001 | Uetani et al. |
| 2002/0132181 | A1 | | 9/2002 | Nishimura et al. |
| 2002/0150834 | A1 | | 10/2002 | Yamamoto et al. |
| 2003/0049456 | A1 | * | 3/2003 | Kawasato et al. ........... 428/421 |
| 2003/0108809 | A1 | | 6/2003 | Sato |
| 2003/0207201 | A1 | | 11/2003 | Hatakeyama et al. |
| 2004/0186216 | A1 | * | 9/2004 | Satoh et al. ................. 524/502 |
| 2004/0259028 | A1 | | 12/2004 | Sato |
| 2005/0014090 | A1 | * | 1/2005 | Hirayama et al. ........ 430/270.1 |
| 2005/0095532 | A1 | | 5/2005 | Kodama et al. |
| 2005/0203262 | A1 | * | 9/2005 | Feiring et al. ............... 526/250 |
| 2007/0065748 | A1 | | 3/2007 | Hada et al. |

FOREIGN PATENT DOCUMENTS

| EP | 982628 | 3/2000 |
| EP | 0 663 616 B1 | 10/2002 |
| JP | 04-039665 | 2/1992 |
| JP | 05-346668 | 12/1993 |
| JP | 7-234511 | 9/1995 |
| JP | 09-073173 | 3/1997 |
| JP | 09-090637 | 4/1997 |
| JP | 10-161313 | 6/1998 |
| JP | 10-226658 | 8/1998 |
| JP | 10-319595 | 12/1998 |
| JP | 11-012326 | 1/1999 |
| JP | 2000-137327 | 5/2000 |
| JP | 2000-321771 | 11/2000 |
| JP | 2001-002735 | 1/2001 |
| JP | 2001-183836 | 7/2001 |
| JP | 2002-145954 | 5/2002 |
| JP | 2002-311587 | 10/2002 |
| JP | 2003-140346 | 5/2003 |
| JP | 2003-160612 | 6/2003 |
| JP | 2003-231673 | 8/2003 |
| JP | 2003-261529 | 9/2003 |
| JP | 2003-287884 | 10/2003 |
| JP | 2003-307850 | 10/2003 |
| JP | 2004-85657 | 3/2004 |
| JP | 2005-534956 | 11/2005 |
| WO | WO 02/077116 | * 10/2002 |

OTHER PUBLICATIONS

K.J. Przybilla, H.Roschert and G.Pawlowski—"Hexafluoroacetone in Resist Chemistry: A Versatile New Concept for Materials for Deep UV Lithography", SPIE vol. 1672 Advances in Resist Technology and Processing IX (1992), pp. 500-512.*

(Continued)

Primary Examiner—Cynthia H Kelly
Assistant Examiner—Anca Eoff
(74) Attorney, Agent, or Firm—Knobbe, Martens, Olson & Bear, LLP

(57) ABSTRACT

A resin for photoresist compositions is disclosed with excellent resolution and line edge roughness characteristics. A photoresist composition and a method for forming a resist pattern using such a resin are also disclosed. The resin has a hydroxyl group bonded to a carbon atom at a polymer terminal, and the carbon atom in the α-position to the hydroxyl group has at least one electron attractive group.

11 Claims, No Drawings

OTHER PUBLICATIONS

International Search Report from PCT priority application serial No. PCT/JP2004/008004.

Written Opinion from PCT priority application serial No. PCT/JP2004/008004.

Office Action and Taiwan IPO Search Report from the Taiwan Patent Office issued on Taiwan Patent Application No. 093115553 dated Aug. 31, 2007.

Office Action and Search Report issued on Apr. 10, 2008 on the counterpart Taiwanese Patent Application No. 093130121.

Office Action issued Jun. 10, 2008, on the counterpart Japanese Application No. 2004-57448.

Padmanaban et al, "Performance of Imide and Methide Onium PAGs in 193nm Resist Formulations" Proceedings of SPIE, vol. 5039, pp. 743-751, (2003).

* cited by examiner

RESIN FOR PHOTORESIST COMPOSITION, PHOTORESIST COMPOSITION AND METHOD FOR FORMING RESIST PATTERN

This application is the U.S. National Phase under 35 U.S.C. §371 of International Application PCT/JP2004/008004, filed Jun. 2, 2004, which claims priority to Japanese Patent Application No. 2004-057449, filed Mar. 2, 2004, Japanese Patent Application No. 2003-428853, filed on Dec. 25, 2003, and Japanese Patent Application No. 2003-160478 filed on Jun. 5, 2003. The International Application was published under PCT Article 21(2) in a language other than English.

TECHNICAL FIELD

The present invention relates to a resin for a photoresist composition, a photoresist composition, and a method for forming a photoresist composition.

BACKGROUND ART

Until recently, polyhydroxystyrenes or derivatives thereof in which the hydroxyl groups are protected with acid dissociable, dissolution inhibiting groups, which display high transparency relative to a KrF excimer laser (248 nm), have been used as the base resin component of chemically amplified resists. However, these days, the miniaturization of semiconductor elements has progressed even further, and the development of processes that use ArF excimer lasers (193 nm) to produce very fine resist patterns of 130 nm or less is being vigorously pursued.

For processes using an ArF excimer laser as the light source, resins such as polyhydroxystyrenes that contain benzene rings have insufficient transparency relative to the ArF excimer laser (193 nm).

Accordingly, resins capable of resolving this problem, which contain no benzene rings and exhibit superior levels of transparency and dry etching resistance, and which include, within the principal chain, a structural unit derived from a (meth)acrylate ester that includes a polycyclic hydrocarbon ring such as an adamantane skeleton at the ester grouping have already been proposed (see patent references 1 through 8).

Examples of this type of conventional photoresist composition include chemically amplified compositions containing a resin component obtained, for example, by radical polymerization, an acid generator component, and an organic solvent. Furthermore, in the patent reference 9, a resin is disclosed in which polymerization is conducted using a chain transfer agent that contains no polar groups at the terminals.

(Patent Reference 1) Japanese Patent (Granted) Publication No. 2,881,969

(Patent Reference 2) Japanese Unexamined Patent Application, First Publication No. Hei 5-346668

(Patent Reference 3) Japanese Unexamined Patent Application, First Publication No. Hei 7-234511

(Patent Reference 4) Japanese Unexamined Patent Application, First Publication No. Hei 9-73173

(Patent Reference 5) Japanese Unexamined Patent Application, First Publication No. Hei 9-90637

(Patent Reference 6) Japanese Unexamined Patent Application, First Publication No. Hei 10-161313

(Patent Reference 7) Japanese Unexamined Patent Application, First Publication No. Hei 10-319595

(Patent Reference 8) Japanese Unexamined Patent Application, First Publication No. Hei 11-12326

(Patent Reference 9) Japanese Unexamined Patent Application, First Publication No. 2001-2735

In recent years, the design rules required in semiconductor element production have continued to become more stringent, and improvements in resolution, such as a resolution of no more than 130 nm, and in the vicinity of 100 nm, are now being required. In addition, the occurrence of line edge roughness (LER) in the resist pattern following developing is also a problem. This LER appears as distortions around the hole patterns in a hole resist pattern, or as non-uniform irregularities in the side walls in a line and space pattern. As demands for higher resolutions grow, this LER must continue to be reduced. Furthermore, as semiconductor elements undergo ever greater miniaturization, reductions in the level of defects are also keenly sought.

However, the improvements in LER and defect occurrence provided by conventional photoresist compositions are inadequate.

DISCLOSURE OF INVENTION

The present invention takes the above circumstances into consideration, with an object of providing a resin that can be used in a photoresist composition which exhibits favorable resolution and LER characteristics, and enables a reduction in the level of defects, as well as providing a photoresist composition and a method for forming a resist pattern that use such a resin.

In the present invention, the above object was achieved by the following aspects.

Namely, a first aspect of the present invention provides a resin for a photoresist composition, wherein the resin has a hydroxyl group bonded to a carbon atom at a polymer terminal, and the carbon atom in the α-position to the hydroxyl group has at least one electron attractive group.

A second aspect of the present invention is a resin for a photoresist composition, having a substituent with a pKa value of 6 to 12 at a polymer terminal.

A third aspect of the present invention is a photoresist composition that includes a resin for a photoresist composition according to the present invention.

A fourth aspect of the present invention is a method for forming a resist pattern that uses a photoresist composition of the present invention.

In this description, the term "structural unit" refers to a monomer unit which contributes to the formation of a polymer (resin).

(Effects of the Invention)

The present invention is able to provide a photoresist composition and a method for forming a resist pattern that exhibit improved resolution and LER characteristics, and a reduced level of defects.

BEST MODE FOR CARRYING OUT THE INVENTION

[Resin for Resist Composition]

First Aspect

A resin for a resist composition according to the first aspect has a hydroxyl group bonded to a carbon atom at a polymer terminal, and the carbon atom in the α-position to the hydroxyl group has at least one electron attractive group.

Examples of this electron attractive group include a halogen atom or a halogenated alkyl group or the like.

Examples of suitable halogen atoms include a fluorine atom, a chlorine atom, or the like, although a fluorine atom is preferred.

In a halogenated alkyl group, the halogen refers to the same halogen atoms as described above. The alkyl group is preferably a lower alkyl group of 1 to 3 carbon atoms, and is preferably a methyl group or ethyl group, and most preferably a methyl group. Specific examples of suitable groups include a trifluoromethyl group, difluoromethyl group, monofluoromethyl group, and perfluoroethyl group, although a trifluoromethyl group is particularly desirable.

The number of electron attractive groups is either 1 or 2, but is preferably 2.

The above description of a resin having a hydroxyl group bonded to a carbon atom, wherein the carbon atom in the a-position to the hydroxyl group has at least one electron attractive group can be expressed more specifically, and ideally, as a resin having a —$CR^1R^2OH$ group, wherein $R_1$ and $R^2$ each represent, independently, an alkyl group, halogen atom, or halogenated alkyl group, and at least one of $R_1$ and $R^2$ is an electron attractive group selected from the group consisting of halogen atoms and halogenated alkyl groups.

The halogen atoms and halogenated alkyl groups are as defined above, whereas suitable examples of the alkyl group include lower alkyl groups such as a methyl group, ethyl group, or propyl group. The lower alkyl group preferably contains from 1 to 5 carbon atoms. As described above, the electron attractive group is preferably a fluorine atom or a fluorinated alkyl group, and compounds in which both $R^1$ and $R^2$ are fluorinated alkyl groups, and particularly trifluoromethyl groups, are preferred in terms of the ease of synthesis, and the effect of the compound in reducing LER.

In this resin for a photoresist composition, the proportion of structural units (M1) that include the aforementioned —$CR^1R^2OH$ group bonded to a polymer terminal (hereafter, this group may also be referred to as the "terminal structure") is preferably at least 1 mol % (and preferably 2 mol % or higher) relative to the combined 100 mol % of all the structural units other than the structural units (M1) within the photoresist composition resin (resin for a photoresist composition).

This combination of all the structural units other than the structural units (M1) includes structural units derived from a conventional polymerization initiator such as azobisisobutyronitrile (AIBN), and structural units derived from the monomer that represents the primary component of the resin.

There are no particular restrictions on the upper limit for the above proportion, although considering practical factors such as the production method, the value is typically no more than 5 mol %. Furthermore, depending on the nature of the composition, if the proportion of the above terminal structures is too high, then undesirable phenomena such as thickness loss in the resist pattern, and slight tapering at the base of the patterns may occur. The number of mols of the structural unit (M1) is, of course, equal to the number of mols of the terminal structure, and the number of mols of hydroxyl groups.

By ensuring that the proportion is at least 1 mol %, a superior LER improvement effect can be realized as a result of the introduction of the terminal structure. If the proportion is less than 1 mol %, then there is a tendency for this effect to deteriorate.

The terminal structure can be introduced at a polymer terminal, for example, by adding a chain transfer agent containing a —$CR^1R^2OH$ group during production of the polymer by radical polymerization using a monomer and a polymerization initiator. In this case, the structural unit (M1) containing the terminal structure is a structural unit (M1) derived from the chain transfer agent.

The chain transfer agent is represented, for example, by a general formula X—R'—$CR^1R^2OH$.

In this formula, X represents a hydroxyl group or thiol group, and this type of chain transfer agent bonds to the polymer terminal through elimination of the hydrogen atom of the hydroxyl group or thiol group. Accordingly, the structural unit (M1) in this case is the unit generated when the hydrogen atom is removed from the hydroxyl group or thiol group of the group X within the formula X—R'—$CR^1R^2OH$. In terms of reactivity, X is most preferably a thiol group.

Furthermore, R40 represents a bivalent aliphatic hydrocarbon group (which may be a straight-chain, branched-chain, or cyclic group) or a bivalent aromatic hydrocarbon group, and of these, a straight-chain or branched-chain aliphatic hydrocarbon group is preferred.

An example of a suitable alicyclic group is a cyclohexylene group. An example of a suitable aromatic hydrocarbon group is a p-phenylene group.

Examples of suitable straight-chain and branched-chain aliphatic hydrocarbon groups include a methylene group, ethylene group, n-propylene group, and isopropylene group, and of these, an ethylene group or n-propylene group is preferred.

Preferred chain transfer agents can be represented by the general formula SH—$(CH_2)_m$—$C(CF_3)_2$—OH (wherein, m represents an integer from 2 to 4). Accordingly, preferred forms for the structural unit (M1) can be represented by a general formula —S—$(CH_2)_m$—$C(CF_3)_2$—OH.

The proportion of the terminal structure (the proportion of the structural unit (M1)) can be altered by adjusting the relative quantities of the monomer and the chain transfer agent, and by adjusting the timing of the addition of the chain transfer agent, thereby altering the weight average molecular weight of the resin for the resist composition.

Furthermore, in a synthesized resist composition resin, the number of mols of the terminal structure (the number of mols of the structural unit (M1)) can be measured by NMR techniques (nuclear magnetic resonance spectroscopy) such as proton-NMR or carbon-NMR.

There are no particular restrictions on the structural units other than the structural unit (M1), and any units typically used in resins for resist compositions, and preferably units that are produced by radical polymerization, can be used.

The present invention can be applied to resins for either non-chemically amplified or chemically amplified photoresist compositions, although chemically amplified compositions are preferred.

Furthermore, the present invention can be applied to either negative or positive chemically amplified compositions, although positive compositions are preferred. Examples of resins for chemically amplified positive resist compositions include resins in which acid dissociable, dissolution inhibiting groups (protective group) have been introduced into a hydroxystyrene-based resin, which are widely used with KrF excimer lasers, and resins in which acid dissociable, dissolution inhibiting groups have been introduced into a (meth) acrylate-based resin (wherein the term (meth)acrylate refers to acrylate and/or methacrylate), which are widely used with ArF excimer lasers.

As the acid dissociable, dissolution inhibiting group, any of the groups used with hydroxystyrene-based resins and (meth)acrylate-based resins can be used.

Specific examples of suitable groups include chain-like alkoxyalkyl groups, tertiary alkyloxycarbonyl groups, tertiary alkyl groups, tertiary alkoxycarbonylalkyl groups, and cyclic ether groups.

Examples of suitable chain-like alkoxyalkyl groups include 1-ethoxyethyl groups, 1-methoxymethylethyl groups, 1-isopropoxyethyl groups, 1-methoxypropyl groups, and 1-n-butoxyethyl groups; examples of suitable tertiary alkyloxycarbonyl groups include tert-butyloxycarbonyl groups and tert-amyloxycarbonyl groups; examples of suitable tertiary alkyl groups include chain-like tertiary alkyl groups such as tert-butyl groups and tert-amyl groups, and tertiary alkyl groups that contain an aliphatic polycyclic group, such as 2-methyl-2-adamntyl groups and 2-ethyl-2-adamantyl groups; examples of suitable tertiary alkoxycarbonylalkyl groups include tert-butyloxycarbonylmethyl groups and tert-amyloxycarbonylmethyl groups; and examples of suitable cyclic ether groups include tetrahydropyranyl groups and tetrahydrofuranyl groups. As follows is a description of specific examples of preferred (meth)acrylate-based resins of the present invention.

Examples of the structural units other than the structural unit (M1) include the following types of units.

(a1): Structural units derived from a (meth)acrylate ester containing an acid dissociable, dissolution inhibiting group.

The resin may also contain the structural units (a2) and (a3) described below, and resins that contain the structural units (a1) and (a2) are preferred, and resins that contain (a1), (a2), and (a3) are even more desirable.

(a2): Structural units derived from a (meth)acrylate ester containing a lactone ring.

(a3): Structural units derived from a (meth)acrylate ester containing a hydroxyl group.

Normally, in addition to the aforementioned terminal structure, a small quantity of structural units derived from the radical polymerization initiator are also introduced at the polymer terminals.

Structural Unit (a1)

In the structural unit (a1), there are no particular restrictions on the acid dissociable, dissolution inhibiting group. Typically, groups that form cyclic or chain-like tertiary alkyl esters with the side-chain carboxyl group of a (meth)acrylate are widely known, and of these, aliphatic monocyclic or polycyclic group-containing acid dissociable, dissolution inhibiting groups are preferred, and aliphatic polycyclic group-containing acid dissociable, dissolution inhibiting groups are particularly desirable.

Examples of aliphatic monocyclic groups include groups in which one hydrogen atom has been removed from a cycloalkane. Specific examples include groups in which one hydrogen atom has been removed from a cyclohexane or the like.

Examples of aliphatic polycyclic groups include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. Of these groups, adamantyl groups, norbornyl groups, and tetracyclododecanyl groups are preferred industrially.

More specific examples include the groups represented by the general formulas (I), (II), and (III) shown below.

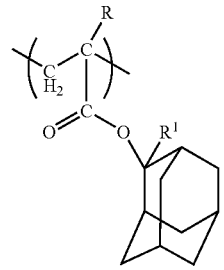

(I)

(wherein, R represents a hydrogen atom or a methyl group, and $R_1$ represents a lower alkyl group)

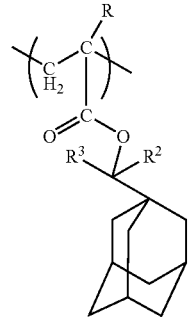

(II)

(wherein, R represents a hydrogen atom or a methyl group, and $R^2$ and $R^3$ each represent, independently, a lower alkyl group)

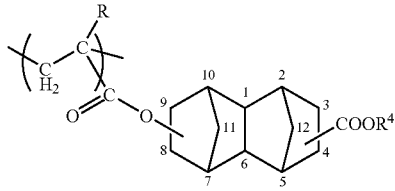

(III)

(wherein, R represents a hydrogen atom or a methyl group, and $R^4$ represents a tertiary alkyl group)

In the formulas, the group $R_1$ is preferably a lower straight-chain or branched alkyl group of 1 to 5 carbon atoms, and suitable examples include a methyl group, ethyl group, propyl group, isopropyl group, n-butyl group, isobutyl group, pentyl group, isopentyl group, and neopentyl group. Of these, a methyl group or ethyl group is preferred in terms of industrial availability.

The aforementioned groups $R^2$ and $R^3$ each preferably represent, independently, a lower alkyl group of 1 to 5 carbon atoms. Of the structural units represented by the formula (II), cases in which $R^2$ and $R^3$ are both methyl groups are preferred industrially, and specific examples include structural units derived from 2-(1-adamantyl)-2-propyl (meth)acrylate.

The aforementioned group $R^4$ is a tertiary alkyl group such as a tert-butyl group or tert-amyl group, although structural units in which $R^4$ is a tert-butyl group are preferred industrially.

Furthermore, the group —COOR$^4$ may be bonded to either position 3 or 4 of the tetracyclododecanyl group shown in the formula, and the bonding position cannot be further specified. Similarly, the carboxyl group residue of the (meth)acrylate structural unit may be bonded at either position 8 or 9 in the formula, and the bonding position cannot be further specified.

The structural unit (a1) typically accounts for 20 to 60 mol %, and preferably from 30 to 50 mol %, of the combined total of all the structural units.

Structural unit (a2)

Examples of the structural unit (a2) include structural units in which either a monocyclic group formed from a lactone ring, or an aliphatic polycyclic ring containing a lactone ring, is bonded to an ester side chain of a (meth)acrylate ester. Here, the term lactone ring refers to a single ring that contains a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

Specific examples of the structural unit (a2) include monocyclic groups in which one hydrogen atom has been removed from γ-butyrolactone, and polycyclic groups in which one hydrogen atom has been removed from a lactone group-containing bicycloalkane.

Specifically, structural units represented by structural formulas (IV) to (VII) shown below are preferred.

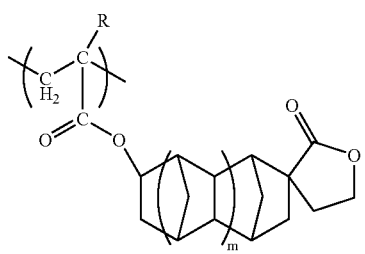
(IV)

(wherein, R represents a hydrogen atom or a methyl group, and m represents either 0 or 1)

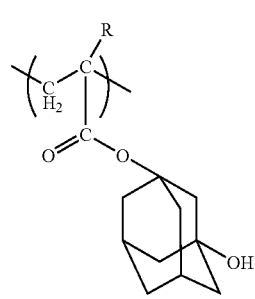
(V)

(wherein, R represents a hydrogen atom or a methyl group)

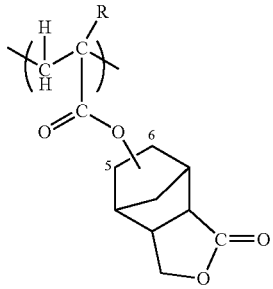
(VI)

(wherein, R represents a hydrogen atom or a methyl group)

The structural unit represented by the formula (VI) exists as an isomeric mixture in which the bonding position of the (meth)acrylate group to the polycyclic group is a mixture of position 5 and position 6.

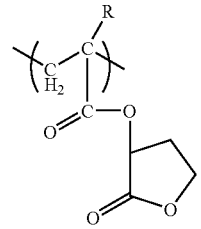
(VII)

(wherein, R represents a hydrogen atom or a methyl group)

The structural unit (a2) typically accounts for 20 to 60 mol %, and preferably from 30 to 50 mol %, of the combined total of all the structural units.

Structural unit (a3)

As the structural unit (a3), any of the multitude of structural units proposed for inclusion within resins for photoresist compositions for use with ArF excimer lasers and the like can be used, and hydroxyl group-containing aliphatic polycyclic groups are preferred. The polycyclic group can be selected appropriately from the same plurality of polycyclic groups described above in relation to the aforementioned structural unit (a1).

Specifically, as the structural unit (a3), units that include a hydroxyl group-containing adamantyl group or a carboxyl group-containing tetracyclododecanyl group can be used particularly favorably.

Even more specific examples include structural units represented by a general formula (VIII) shown below.

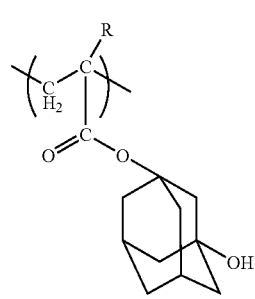
(VIII)

(wherein, R represents a hydrogen atom or a methyl group)

The structural unit (a3) typically accounts for 10 to 50 mol %, and preferably from 10 to 40 mol %, of the combined total of all the structural units.

Furthermore, other structural units (a4) different from the structural units (a1) to (a3) can also be included.

There are no particular restrictions on the structural unit (a4), provided it is a different structural unit that cannot be classified as any of the above structural units (a1) through (a3).

For example, structural units containing an aliphatic polycyclic group and derived from a (meth)acrylate ester are preferred. Suitable examples of the polycyclic group include similar groups to those listed in the above description for the structural unit (a1), and one or more groups selected from amongst tricyclodecanyl groups, adamantyl groups, and tetracyclododecanyl groups is preferred in terms of industrial availability.

Specific examples of the structural unit (a4) include the structures shown below in formulas (IX) to (XI).

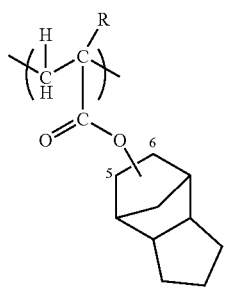

(IX)

(wherein, R represents a hydrogen atom or a methyl group)

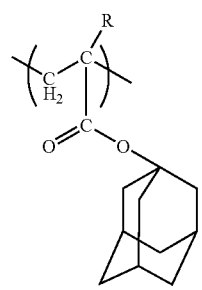

(X)

(wherein, R represents a hydrogen atom or a methyl group)

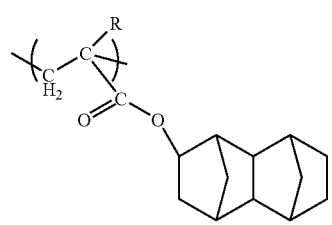

(XI)

(wherein, R represents a hydrogen atom or a methyl group)

The structural unit (a4) typically accounts for 1 to 25 mol %, and preferably from 5 to 20 mol %, of the combined total of all the structural units.

The resist composition resin may include a single resin, or a mixture of two or more different resins.

A resin for a resist composition of the present invention can be obtained by polymerizing the monomers that give rise to the structural units other than the structural unit (M1), for example by a conventional radical polymerization using a radical polymerization initiator such as azobisisobutyronitrile, and then adding a chain transfer agent containing the aforementioned terminal group, thereby causing chain transfer in the polymerization, at a time that is most suitable in terms of regulating the weight average molecular weight and adjusting the proportion of the structural unit (M1) within the resin.

The weight average molecular weight (the polystyrene-equivalent weight average molecular weight determined by gel permeation chromatography, this also applies to all subsequently molecular weight values) of the resist composition resin of the present invention is typically no more than approximately 12,000, and preferably no more than 10,000, and even more preferably 8,000 or less.

By restricting the molecular weight to 8,000 or less, the quantity of the terminal group introduced into the resin can be increased, thereby enhancing the LER improvement effect. Furthermore, another effect is achieved in that a more rectangular pattern cross-sectional shape can be obtained.

Although there are no particular restrictions on the lower limit for the molecular weight, in terms of suppressing pattern collapse and improving the resolution, a value of at least 4,000 is preferred, and values of 5,000 or greater are even more desirable.

In the first aspect, by employing this type of structure for the resist composition resin, the LER characteristics can be improved. In addition, the occurrence of resist pattern collapse can also be suppressed. Furthermore, this reduction in pattern collapse improves the resolution. Furthermore, the depth of focus characteristics also improve, and the level of defects also decreases.

The reason for the improvement in LER is not entirely clear, although it is surmised that whereas the polymer terminals of conventional resin components obtained by radical polymerization include structures derived from hydrophobic polymerization initiators or hydrophobic chain transfer agents (terminators), which may inhibit the solubility of the resin in the alkali developing solution, in the present invention, the existence of the electron attractive group means the hydrogen atom of the hydroxyl group can readily dissociate, thereby imparting a suitable degree of acidity to the resin, and consequently improving the solubility of the resin in the alkali developing solution, and improving the LER characteristics at the interface between the exposed portions and the unexposed portions of the resist pattern.

Second Aspect

A resin for a resist composition according to the second aspect has a substituent with a pKa value of 6 to 12, and preferably from 7 to 10, at a polymer terminal.

By ensuring a pKa value within this range, a suitable degree of acidity can be generated, meaning favorable LER characteristics can be achieved, and enabling swelling of the resist pattern to be suppressed.

An example of a group capable of generating a hydrogen ion at the above substituent group is an alcoholic hydroxyl group.

The hydroxyl groups of carboxyl groups tend to have pKa values that are too small, meaning an undesirable degree of swelling occurs upon alkali developing.

The pKa of the substituent group is small if an electron attractive group is bonded to the carbon atom in the α-position to the alcoholic hydroxyl group, and is large if no such electron attractive group exists. In other words, the pKa value varies depending on the characteristics of the terminal structure, which includes the above alcoholic hydroxyl group, the carbon atom in the α-position, and the atoms and/or substituent groups bonded to this α-carbon atom (but excluding the carbon atom at the β-position).

The pKa can be altered by adjusting the nature and number of electron attractive groups bonded to the carbon atom at the α-position, and by adjusting the nature of substituent groups at the polymer terminal.

In other words, by bonding an electron attractive group to the carbon atom at the α-position, in a similar manner to the first aspect, the pKa value can be reduced.

In order to satisfy the above pKa numerical range, a configuration of the first aspect is preferred, and a structure in which the substituent is a —$CR^1R^2OH$ group (wherein, $R^1$ and $R^2$ each represent, independently, an alkyl group, halogen atom, or halogenated alkyl group, and at least one of $R^1$ and $R^2$ is an electron attractive group selected from the group consisting of halogen atoms and halogenated alkyl groups) is particularly desirable.

The pKa value is represented by the acid dissociation constant in an aqueous solution. The pKa value can be measured by preparing a monomer for which the degree of acidity of the terminal structure can be measured, and then measuring the pKa using a quantitative method such as titration.

Furthermore, the pKa value can also use values reported in reference documents and the like.

In the second aspect, by using a resist composition resin with this type of structure, the LER characteristics can be improved.

In addition, the occurrence of resist pattern collapse can also be reduced. Furthermore, this reduction in pattern collapse improves the resolution. Furthermore, the depth of focus characteristics also improve. The level of defects also decreases.

The reason for the improvement in LER is the same as the reason described for the first aspect.

[Photoresist Composition]

Provided a photoresist composition of the present invention uses a resin for a resist composition according to the present invention, there are no particular restrictions on the other components within the composition.

For example, in the case of a chemically amplified positive photoresist composition, the composition includes a resin component (A), which is a resist composition resin according to the present invention that also contains acid dissociable, dissolution inhibiting groups, an acid generator component (B), an organic solvent (C), and where necessary, other components such as a nitrogen-containing organic compound (D) or the like. Hereafter is a description of a sample composition that is suited to exposure using an ArF excimer laser.

The quantity of the component (A) may be adjusted in accordance with the film thickness of the resist being formed. Typically, the quantity of the component (A), reported as a solid fraction concentration, is within a range from 8 to 25% by weight, and is preferably from 10 to 20% by weight.

Acid Generator Component (B)

In the present invention, the component (B) may include known acid generators used in conventional chemically amplified photoresist compositions. A large variety of acid generators are already known, including onium salts such as iodonium salts and sulfonium salts, oxime sulfonates, bis-alkyl or bisaryl sulfonyl diazomethanes, nitrobenzyl sulfonates, iminosulfonates, and disulfones, and any of these known acid generators can be used without any particular restrictions.

Of these, (b-0) onium salts that include a fluorinated alkylsulfonate ion as the anion result in the generation of stronger acids, and are consequently ideal.

Examples of suitable cations for these (b-0) onium salts include mono- or diphenyliodonium cations, and mono-, di-, or triphenyl sulfonium cations, all of which may be substituted with lower alkyl groups such as methyl groups, ethyl groups, propyl groups, n-butyl groups, and tert-butyl groups, or lower alkoxy groups such as methoxy groups and ethoxy groups; as well as dimethyl(4-hydroxynaphthyl)sulfonium cations or the like.

Furthermore, the anion for the onium salt (b-0) is preferably a fluorinated alkylsulfonate ion.

Of these, a fluorinated alkylsulfonate ion in which either a portion of, or all of, the hydrogen atoms of a straight-chain alkyl group of 1 to 7 carbon atoms, and preferably 1 to 3 carbon atoms, have been fluorinated is particularly desirable. Ensuring the number of carbon atoms is no more than 7 increases the strength of the resulting sulfonic acid.

Furthermore, the fluorination ratio (the proportion of fluorine atoms within the alkyl group) of the fluorinated alkylsulfonate ion is preferably within a range from 10 to 100%, and even more preferably from 50 to 100%, and anions in which all of the hydrogen atoms have been substituted with fluorine atoms are particularly desirable as they yield stronger acids.

Specific examples of this type of anion include the trifluoromethanesulfonate, heptafluoropropanesulfonate, and nonafluorobutanesulfonate anions.

Specific examples of (b-0) include diphenyliodonium trifluoromethanesulfonate, heptafluoropropanesulfonate or nonafluorobutanesulfonate, bis(4-tert-butylphenyl)iodonium trifluoromethanesulfonate, heptafluoropropanesulfonate or nonafluorobutanesulfonate, (4-methoxyphenyl)phenyliodonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, dimethyl(4-hydroxynaphthyl) trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, triphenylsulfonium trifluoromethanesulfonate, heptafluoropropanesulfonate or nonafluorobutanesulfonate, (4-methoxyphenyl) diphenylsulfonium trifluoromethanesulfonate, heptafluoropropanesulfonate or nonafluorobutanesulfonate, (p-tert-butylphenyl) diphenylsulfonium trifluoromethanesulfonate, heptafluoropropanesulfonate or nonafluorobutanesulfonate, tri(p-tert-butylphenyl)sulfonium trifluoromethanesulfonate, heptafluoropropanesulfonate or nonafluorobutanesulfonate, and (4-trifluoromethylphenyl) diphenylsulfonium trifluoromethanesulfonate, heptafluoropropanesulfonate or nonafluorobutanesulfonate.

In the present invention, iminosulfonate-based acid generators, which represent. a different acid generator from the aforementioned (b-0) salts, can also be used favorably.

Specific examples of suitable iminosulfonate-based acid generators include compounds represented by general formulas (b-1) and (b-2) shown below (hereafter, these compounds may also be referred to as sulfonium compounds 1 and sulfonium compounds 2 respectively).

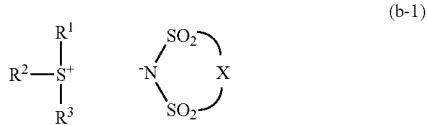

-continued

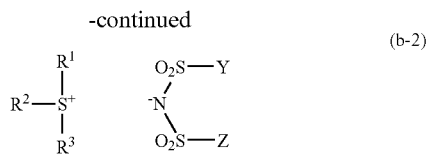
(b-2)

In the general formulas (b-1) and (b-2), X represents a straight-chain or branched alkylene group in which at least one hydrogen atom has been substituted with a fluorine atom, and the number of carbon atoms within the alkylene group is typically within a range from 2 to 6, and preferably from 3 to 5, and most preferably 3.

Y and Z each represent, independently, a straight-chain or branched alkyl group in which at least one hydrogen atom has been substituted with a fluorine atom, and the number of carbon atoms within the alkyl group is typically within a range from 1 to 10, and preferably from 1 to 7, and most preferably from 1 to 3. Lower numbers of carbon atoms within the alkylene group X or the alkyl groups Y and Z result in better solubility within the resist solvent, which is desirable.

Furthermore, in the alkylene group X or the alkyl groups Y and Z, the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene or perfluoroalkyl groups in which all of the hydrogen atoms have been substituted with fluorine atoms are the most desirable.

$R^1$ to $R^3$ each represent, independently, an aryl group or an alkyl group.

Of the groups $R^1$ to $R^3$, at least one group is an aryl group. Compounds in which at least two of $R^1$ to $R^3$ represent aryl groups are preferred, and compounds in which all of $R^1$ to $R^3$ are aryl groups are the most preferred.

There are no particular restrictions on the aryl groups of $R^1$ to $R^3$, and suitable examples include aryl groups of 6 to 20 carbon atoms, such as phenyl groups and naphthyl groups, which may, or may not, be substituted with alkyl groups and/or halogen atoms and the like. In terms of enabling low cost synthesis, aryl groups of 6 to 10 carbon atoms are preferred.

There are no particular restrictions on the alkyl groups of $R^1$ to $R^3$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low cost synthesis, a methyl group is the most desirable.

Of the above possibilities, compounds in which $R^1$ to $R^3$ are all phenyl groups are the most preferred.

The compounds represented by these general formulas (b-1) and (b-2) can be used either alone, or in combinations of two or more different compounds. Of the possible compounds, sulfonium compounds 1 represented by the general formula (b-1) are preferred, and the compound represented by a chemical formula (XIII) shown below is the most preferred.

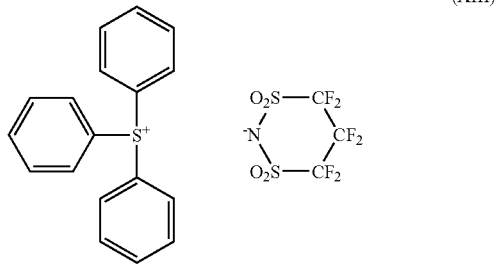
(XIII)

In the present invention, by combining at least one compound selected from the above sulfonium compounds 1 and 2, with an aforementioned resin for a resist composition according to the present invention, a particularly superior defect reduction effect is achieved. Here, the term "defect" refers to scum and general resist pattern abnormalities detected by inspection of a resist pattern following developing, from directly above the resist pattern, using a surface defect inspection device (brand name: KLA) from KLA Tencor Corporation. These types of defects can cause reductions in process yields, and a deterioration in the product performance, and consequently represent an extremely large problem. A number of factors are thought to cause these defects, including the resist resolution performance, irregularities in the alkali solubility arising from insoluble matter or impurities within the resist, and the surface state of the resist.

The reason for the above defect reduction effect is thought to relate to the fact that, as described above, the resist resolution performance is one cause of defects, and it is believed that the resolution has a significant effect on the level of defects. It is thought that because the sulfonium compounds 1 and 2 include a bulky iminosulfonate structure as shown in the formulas (b-1) and (b-2), the diffusion length is short even if the number of carbon atoms is small, and consequently, a high level of resolution results. Particularly in the case of the sulfonium compounds 1, the presence of the cyclic structure means the diffusion length is even shorter, thereby suggesting an even higher resolution can be expected. It is thought that this results in a reduction in the level of defects.

This type of defect reduction effect is particularly important in those cases where a fine contact hole (CH) pattern is to be formed. This is because when a fine CH pattern is formed, patterning must be conducted with a very low light intensity to ensure formation of a CH pattern of very small size, and this leads to an increase in the likelihood of defects such as blockages within the upper or interior portions of the CH pattern, or color irregularities.

In those cases where a mixture of an aforementioned (b-0) salt and at least one compound selected from amongst the sulfonium compounds 1 and 2 is used as the above (B) component, the proportion of the (b-0) salt is preferably within a range from 10 to 75% by weight, and even more preferably from 30 to 70% by weight. By using a blend of the (b-0) salt that falls within the above range, a resin with particularly superior LER and defect (developing defect) characteristics can be obtained.

Furthermore, the blend ratio (weight ratio) between the (b-0) salt and the one or more compounds selected from amongst the sulfonium compounds 1 and 2 is preferably within a range from 1:9 to 9:1, and preferably from 1:5 to 5:1, and even more preferably from 1:2 to 2:1. By mixing the acid generators using this type of ratio, a resin with particularly superior LER and developing defect characteristics can be obtained. Using a mixture of a sulfonium compound represented by the general formula (b-1) and a (b-0) salt is the most preferred configuration.

The component (B) is preferably used in a quantity within a range from 0.1 to 30 parts by weight, and preferably from 0.5 to 20 parts by weight, and even more preferably from 1 to 10 parts by weight, per 100 parts by weight of the component (A). At quantities below the lower limit of the above range, image formation becomes impossible, whereas if the quantity exceeds 30 parts by weight, forming a homogeneous solution becomes difficult, and there is a danger of a deterioration in storage stability.

Organic Solvent (C)

A positive resist composition of the present invention can be produced by dissolving the above materials in an organic solvent (C) (hereafter referred to as the component (C)).

As the component (C), any solvent capable of dissolving the components used to generate a homogeneous solution is suitable, and the solvent used can be one, or two or more solvents selected from amongst known solvents used for conventional chemically amplified resists.

Examples of suitable solvents include γ-butyrolactone, ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. Mixed solvents of propylene glycol monomethyl ether acetate (PGMEA) and a polar solvent are preferred. The mixing ratio within this type of mixed solvent can be determined on the basis of the co-solubility of the PGMEA and the polar solvent, but is preferably within a range from 1:9 to 8:2, and even more preferably from 2:8 to 5:5

More specifically, in those cases where ethyl lactate (EL) is added as the polar solvent, the weight ratio of PGMEA:EL is preferably within a range from 2:8 to 5:5, and even more preferably from 3:7 to 4:6. Furthermore, as the organic solvent, a mixed solvent of at least one of PGMEA and EL, together with γ-butyrolactone is also preferred. In such cases, the weight ratio between the former and latter components is preferably within a range from 70:30 to 95:5. There are no particular restrictions on the quantity used of the component (C), which is set in accordance with the resist film thickness so as to produce a concentration that enables favorable application of the composition to a substrate, and is typically sufficient to produce a solid fraction concentration within the resist composition of 2 to 20% by weight, and preferably from 5 to 15% by weight.

Nitrogen-Containing Organic Compound (D)

In order to improve the resist pattern shape and the post exposure stability of the latent image formed by the patternwise exposure of the resist layer, a nitrogen-containing compound (D) can also be added as an optional component (D).

A multitude of these nitrogen-containing organic compounds have already been proposed, and one of these known compounds can be used, although an amine, and particularly a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, triisopropylamine, tripentylamine, diethanolamine, triethanolamine, and triisopropanolamine, and tertiary alkanolamines such as triethanolamine are particularly preferred. These may be used either alone, or in combinations of two or more different compounds.

These compounds are typically added in a quantity within a range from 0.01 to 5.0 parts by weight per 100 parts by weight of the component (A).

Furthermore, in order to prevent any deterioration in sensitivity caused by the addition of the aforementioned component (D), and improve the resist pattern shape and the post exposure stability of the latent image formed by the patternwise exposure of the resist layer, an organic carboxylic acid, or a phosphorus oxo acid or derivative thereof can also be added as an optional component (E). Either one, or both of the component (D) and the component (E) can be used.

Examples of suitable organic carboxylic acids include malonic acid, citric acid, malic acid, succinic acid, benzoic acid, and salicylic acid. Of these, salicylic acid is preferred.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Other Optional Components

Other miscible additives can also be added to a photoresist composition according to the present invention according to need, and examples include additive resins for improving the properties of the resist film, surfactants for improving the ease of application, dissolution inhibitors, plasticizers, stabilizers, colorants and halation prevention agents.

[Method for Forming Resist Pattern]

There are no particular restrictions on the method for forming a resist pattern according to the present invention, provided the method uses a photoresist composition of the present invention.

A method for forming a resist pattern of the present invention can be conducted, for example, in the manner described below.

Namely, a positive photoresist composition of the present invention is first applied to the surface of a substrate such as a silicon wafer using a spinner or the like, a prebake is conducted under temperature conditions of 80 to 150° C. for 40 to 120 seconds, and preferably for 60 to 90 seconds, and then following selective exposure of an ArF excimer laser through a desired mask pattern using, for example, an ArF exposure apparatus, PEB (post exposure baking) is conducted under temperature conditions of 80 to 150° C. for 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern which is faithful to the mask pattern can be obtained.

An organic or inorganic anti-reflective film may also be provided between the substrate and the applied layer of the resist composition.

Furthermore, there are no particular restrictions on the wavelength used for the exposure, and depending on the characteristics of the resist composition resin, an ArF excimer laser, KrF excimer laser, $F_2$ excimer laser, or other radiation such as EUV (extreme ultraviolet), VUV (vacuum ultraviolet), electron beam, X-ray or soft X-ray radiation can be used.

In this manner, in the present invention, a resist resin with favorable LER characteristics can be provided, and consequently, a photoresist composition can be provided that is ideal for the production of semiconductor elements and liquid crystal elements and the like. By appropriate selection of the structural units of the resist resin, a chemically amplified photoresist composition can be provided that is particularly suitable for use with wavelengths of 200 nm or shorter, and particularly ArF excimer lasers.

EXAMPLES

As follows is a more detailed description of the present invention using a series of examples.

Example 1

0.1 mols of a monomer containing a 50/30/20 (mol %) mixture of γ-butyrolactone methacrylate (the monomer that corresponds with the unit of the general formula (VII) wherein R is a methyl group), 2-methyl-2-adamantyl methacrylate (the monomer that corresponds with the unit of the general formula (I) wherein R is a methyl group and $R^1$ is a methyl group), and 3-hydroxy-1-adamantyl acrylate (the monomer that corresponds with the unit of the general formula (VIII) wherein R is a hydrogen atom) was dissolved in 150 ml of THF (tetrahydrofuran), a radical polymerization was initiated at 70° C. using AIBN (in a quantity equivalent to 4 mol % relative to 100 mol % of the above monomer), the compound represented by a chemical formula (XIV) shown below (pKa value of the terminal structure: approximately 7) was added as a polymerization chain transfer agent, in a quantity equivalent to 2 mol % relative to 100 mol % of the combination of the above monomer and AIBN, and a polymerization reaction was conducted.

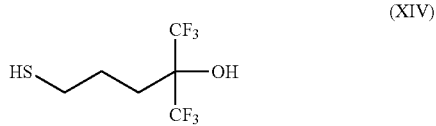

(XIV)

Following completion of the polymerization reaction, the reaction solution was poured into 2,000 ml of n-heptane, the resulting mixture was stirred for 30 minutes at 25° C., and the precipitated solid was recovered by filtration. This solid was then redissolved in 200 ml of THF, and once again poured into 2,000 ml of n-heptane, stirred for 30 minutes at 25° C., and the resulting precipitated resin was recovered by filtration. The weight average molecular weight of the resin was 10,000.

To 100 parts by weight of the thus obtained resist composition resin (the component (A)) were added and dissolved the components listed below, thus producing a positive photoresist composition.

Component (B): 3.0 parts by weight of triphenylsulfonium nonafluorobutanesulfonate
Component (D): 0.1 parts by weight of triethanolamine.
Component (C): 900 parts by weight of a mixed solvent of propylene glycol monomethyl ether acetate and ethyl lactate (weight ratio: 80/20).

Subsequently, the thus obtained chemically amplified positive photoresist composition was applied to the surface of a silicon wafer using a spinner, and was then prebaked (PAB treatment) and dried for 90 seconds at 120° C. on a hotplate, thereby forming a resist layer with a film thickness of 250 nm. This film was then selectively irradiated with an ArF excimer laser (193 nm) through a mask pattern, using an ArF exposure apparatus (NSR-S302, manufactured by Nikon Corporation, NA (numerical aperture)=0.60, 2/3 annular illumination).

The film was then subjected to PEB treatment at 120° C. for 90 seconds, subsequently subjected to puddle development for 60 seconds at 23° C. in a 2.38% by weight aqueous solution of tetramethylammonium hydroxide, and was then washed for 20 seconds with water, and dried.

A resist pattern formed using the exposure dose required for faithfully reproducing a 120 nm line and space pattern (1:1) was inspected for cross-sectional shape using a SEM (scanning electron microscope).

The pattern shape was rectangular, no thickness loss was observed, and the resolution was also favorable.

Furthermore, the depth of focus for the 120 nm line and space pattern (1:1) was 500 nm.

Furthermore, when the 3σ a value, which is a measure of the line edge roughness of the line and space pattern, was determined, the result was 7.2 nm.

The 3σ value is determined by measuring the resist pattern width of the sample at 32 positions using a measuring SEM (S-9220, a brand name, manufactured by Hitachi, Ltd.), and calculating the value of 3 times the standard deviation (3σ) from these measurement results. The smaller this 3σ value is, the lower the level of roughness, indicating a resist pattern with a uniform width.

Defects were measured using a surface defect inspection device KLA2132 (product name) from KLA Tencor Corporation, and the number of defects within the wafer was evaluated. Three wafers were tested, and the average value was determined. The result revealed 3 defects.

Furthermore, when the exposure time for the selective exposure was gradually increased, thereby making the pattern gradually finer, and a measurement was made as to when pattern collapse occurred, it was found that pattern collapse occurred at a pattern width of 57 nm.

Example 2

With the exception of altering the proportion of the chain transfer agent represented by the above chemical formula (XIV) from 2 mol % to 3 mol %, a resist composition resin with a weight average molecular weight of 10,000 was obtained in the same manner as the example 1.

This resin was then evaluated in the same manner as the example 1. The results are summarized in Table 1.

Example 3

With the exception of altering the conditions so that the weight average molecular weight of the resist composition resin was 7,000, a resist composition resin was obtained in the same manner as the example 2.

This resin was then evaluated in the same manner as the example 1. The results are summarized in Table 1.

Example 4

With the exception of altering the monomer composition to a 50/30/20 (mol %) mixture of norbornanelactone acrylate (the monomer that corresponds with the unit of the general formula (V) wherein R is a hydrogen atom), 2-ethyl-2-adamantyl methacrylate (the monomer that corresponds with the unit of the general formula (I) wherein R is a methyl group and $R^1$ is an ethyl group), and 3-hydroxy-1-adamantyl acrylate (the monomer that corresponds with the unit of the general formula (VIII) wherein R is a hydrogen atom), a resist composition resin with a weight average molecular weight of 7,000 was obtained in the same manner as the example 3.

This resin was then evaluated in the same manner as the example 1. The results are summarized in Table 1.

Example 5

With the exception of altering the monomer composition to a 40/40/20 (mol %) mixture of norbornanelactone methacrylate (the monomer that corresponds with the unit of the general formula (VI) wherein R is a methyl group), 2-ethyl-2-adamantyl methacrylate (the monomer that corresponds with the unit of the general formula (I) wherein R is a methyl group and $R^1$ is an ethyl group), and 3-hydroxy-1-adamantyl methacrylate (the monomer that corresponds with the unit of the general formula (VIII) wherein R is a methyl group), a resist composition resin with a weight average molecular weight of 6,400 was obtained in the same manner as the example 1.

This resin was then evaluated in the same manner as the example 1. The results are summarized in Table 1.

Example 6

With the exception of altering the conditions so that the weight average molecular weight of the resist composition resin was 4,800, a resist composition resin was obtained in the same manner as the example 1.

This resin was then evaluated in the same manner as the example 1. The results are summarized in Table 1.

Example 7

With the exception of using 1.5 parts by weight of triphenylsulfonium nonafluorobutanesulfonate and 1.5 parts by weight of the compound represented by a chemical formula (XV) shown below as the component (B), evaluation was conducted in the same manner as the example 5. The results are summarized in Table 1.

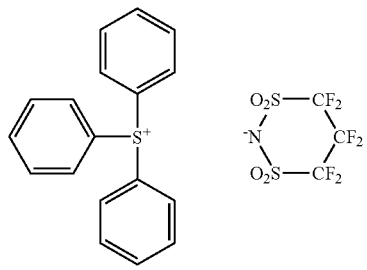

(XV)

Example 8

With the exceptions of altering the monomer composition to a 40/40/20 (mol %) mixture of γ-butyrolactone acrylate (the monomer that corresponds with the unit of the general formula (VII) wherein R is a hydrogen atom), 2-methyl-2-adamantyl methacrylate (the monomer that corresponds with the unit of the general formula (I) wherein R is a methyl group and $R^1$ is a methyl group), and 3-hydroxy-1-adamantyl acrylate (the monomer that corresponds with the unit of the general formula (VIII) wherein R is a hydrogen atom), and altering the proportion of the chain transfer agent represented by the above chemical formula (XIV) to 3 mol %, a resist composition resin with a weight average molecular weight of 7,000 was obtained in the same manner as the example 1. This resin was then evaluated in the same manner as the example 1. The results are summarized in Table 1.

Example 9

With the exceptions of altering the monomer composition to a 40/40/15/5 (mol %) mixture of γ-butyrolactone methacrylate (the monomer that corresponds with the unit of the general formula (VII) wherein R is a methyl group), 2-methyl-2-adamantyl methacrylate (the monomer that corresponds with the unit of the general formula (I) wherein R is a methyl group and $R^1$ is a methyl group), 3-hydroxy-1-adamantyl methacrylate (the monomer that corresponds with the unit of the general formula (VIII) wherein R is a methyl group), and tricyclodecanyl methacrylate (the monomer that corresponds with the structural unit of the general formula (IX) wherein R is a methyl group), and altering the proportion of the chain transfer agent represented by the above chemical formula XIV to 3 mol %, a resist composition resin with a weight average molecular weight of 7,000 was obtained in the same manner as the example 1. This resin was then evaluated in the same manner as the example 1. The results are summarized in Table 1.

Comparative Example 1

With the exception of not using the chain transfer agent, the same method as the example 1 was used to produce a resist composition resin, and subsequently, a resist composition was then prepared with the same composition as that described in the example 1, and a positive photoresist composition was prepared using the same method as the example 1.

Evaluation was then conducted in the same manner as the example 1. The results are summarized in Table 1.

Comparative Example 2

With the exception of not using the chain transfer agent, the same method as the example 4 was used to produce a resist composition resin, and subsequently, a resist composition was then prepared with the same composition as that described in the example 1, and a positive photoresist composition was prepared using the same method as the example 1. Evaluation was then conducted in the same manner as the example 1. The results are summarized in Table 1.

Comparative Example 3

With the exception of not using the chain transfer agent, the same method as the example 5 was used to produce a resist composition resin, and subsequently, a resist composition was then prepared with the same composition as that described in the example 1, and a positive photoresist composition was prepared using the same method as the example 1. Evaluation was then conducted in the same manner as the example 1. The results are summarized in Table 1.

TABLE 1

| | DOF (nm) | Shape | LER (nm) | Collapse (nm) | Defects (number) |
|---|---|---|---|---|---|
| Example 1 | 500 | Rectangular | 7.2 | 57 | 3 |
| Example 2 | 550 | Rectangular (slight base broadening) | 6.5 | 55 | 2 |
| Example 3 | 500 | Rectangular | 5.1 | 58 | 1 |
| Example 4 | 500 | Rectangular | 6 | 60 | 1 |
| Example 5 | 500 | Very rectangular | 5.5 | 55 | 1 |

TABLE 1-continued

| | DOF (nm) | Shape | LER (nm) | Collapse (nm) | Defects (number) |
|---|---|---|---|---|---|
| Example 6 | 500 | Rectangular | 6.1 | 60 | 1 |
| Example 7 | 500 | Very rectangular | 5 | 55 | 1 |
| Example 8 | 500 | Rectangular | 7 | 62 | 1 |
| Example 9 | 400 | Very rectangular | 6.5 | 55 | 1 |
| Comparative example 1 | 500 | Rectangular | 9.8 | 72 | 10 |
| Comparative example 2 | 550 | Rectangular | 8 | 69 | 12 |
| Comparative example 3 | 500 | Rectangular (slight base broadening) | 8 | 65 | 15 |

From the results in Table 1 it is evident that in the examples according to the present invention, the pattern shape is rectangular, the depth of focus characteristics are excellent, the LER characteristics are favorable, and because the occurrence of pattern collapse has been able to be prevented, and thus the resolution is favorable, and the level of defects is favorable. In the example 7, extremely favorable results were obtained for the resist pattern shape, the LER characteristics, and the level of defects.

Example 10

With the exceptions of altering the monomer composition to a 40/40/20 (mol %) mixture of γ-butyrolactone acrylate (the monomer that corresponds with the unit of the general formula (VII) wherein R is a hydrogen atom), 2-ethyl-2-adamantyl methacrylate (the monomer that corresponds with the unit of the general formula (1) wherein R is a methyl group and $R^1$ is an ethyl group), and 3-hydroxy-1-adamantyl methacrylate (the monomer that corresponds with the unit of the general formula (VIII) wherein R is a methyl group), and altering the proportion of the chain transfer agent represented by the above chemical formula XIV to 2.5 mol %, a resist composition resin with a weight average molecular weight of 7,000 was obtained in the same manner as the example 1.

To 100 parts by weight of the thus obtained resist composition resin were added and dissolved the components listed below, thus producing a positive photoresist composition.

Component (B): 2.5 parts by weight of the compound represented by the above chemical formula (XV), and 1.0 parts by weight of the compound represented by a chemical formula (XVI) shown below.

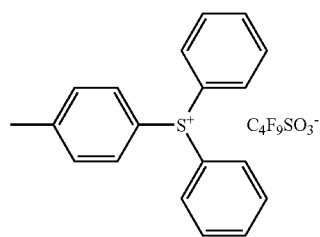

(XVI)

Component (D): triethanolamine (0.1 parts by weight).
Component (E): salicylic acid (0.1 parts by weight).
Component (C): a mixed solvent (1200 parts by weight) of propylene glycol monomethyl ether acetate and ethyl lactate (weight ratio: 60/40).

Subsequently, the thus obtained positive photoresist composition was applied to the surface of a silicon wafer using a spinner, and was then prebaked (PAB treatment) and dried for 90 seconds at 90° C. on a hotplate, thereby forming a resist layer with a film thickness of 220 nm.

This film was then selectively irradiated with an ArF excimer laser (193 nm) through a mask pattern, using an ArF exposure apparatus (NSR-S306, manufactured by Nikon Corporation, NA (numerical aperture)=0.78, σ=0.3).

The film was then subjected to PEB treatment at 90° C. for 90 seconds, subsequently subjected to puddle development for 60 seconds at 23° C. in a 2.38% by weight aqueous solution of tetramethylammonium hydroxide, and was then washed for 20 seconds with water, and dried, thereby yielding a contact hole (CH) pattern) with a hole diameter of 300 nm and a pitch of 500 nm. The sensitivity (Eop) was 18.5 mJ/cm².

Furthermore, when the level of defects was evaluated by using a surface defect inspection device KLA2132 (brand name) from KLA Tencor Corporation to measure the number of defects within the wafer, the result was 8.9 defects/cm². In this example, because the formed pattern was a CH pattern, the area of resist remaining on the substrate is larger than was the case for the line and space patterns (1:1) formed in the examples 1 through 9 and the comparative examples 1 through 3. As a result, the number of defects per wafer was somewhat higher. Because the measurement of developing defects for very fine hole patterns is extremely difficult, developing defects were measured using a 300 nm hole pattern.

Next, the mask was changed to enable evaluation of the resolution and depth of focus, and an isolated hole pattern (pitch: 1,000 nm) with a hole diameter of 130 nm, and a hole pattern (pitch: 220 nm) with a hole diameter of 130 nm were obtained. The depth of focus values were 0.25 μm and 0.3 μm respectively.

INDUSTRIAL APPLICABILITY

The present invention provides a photoresist composition and a method for forming a resist pattern that offer improved resolution and LER characteristics, and reduced levels of defects, and is consequently extremely useful industrially.

The invention claimed is:

1. A resin for a photoresist composition comprising a —$CR^1R^2OH$ group only at a terminal of a principal chain of the resin; (a1) a structural unit derived from a (meth)acrylate ester having an acid dissociable, dissolution inhibiting group; and (a2) a structural unit derived from a (meth)acrylate ester having a lactone ring, wherein $R^1$ and $R^2$ each represent, independently, an alkyl group, halogen atom, or halogenated alkyl group, and at least one of $R^1$ and $R^2$ is an electron attractive group selected from the group consisting of halogen atoms and halogenated alkyl groups.

2. A resin for a photoresist composition according to claim 1, wherein said electron attractive group is a fluorine atom or a fluorinated alkyl group.

3. A resin for a photoresist composition according to claim 1, further comprising (a3) a structural unit derived from a (meth)acrylate ester having a hydroxyl group.

4. A resin for a photoresist composition according to claim 1, with a weight average molecular weight of no more than 12,000.

5. A photoresist composition, comprising a resin for a photoresist composition according to claim 1.

6. A photoresist composition comprising:
a resin comprising a —$CR^1R^2OH$ group only at a terminal of a principal chain of the resin, wherein $R^1$ and $R^2$ each represent, independently, an alkyl group, halogen atom, or halogenated alkyl group, and at least one of $R^1$ and $R^2$ is an electron attractive group selected from the group consisting of halogen atoms and halogenated alkyl groups; and
an acid generator as a component (B).

7. A photoresist composition according to claim 6, comprising as said component (B), (b-0) an onium salt that comprises a fluorinated alkylsulfonate ion as an anion.

8. A photoresist composition according to claim 6, comprising as said component (B), a sulfonium compound represented by either of general formulas (b-1) and (b-2) shown below:

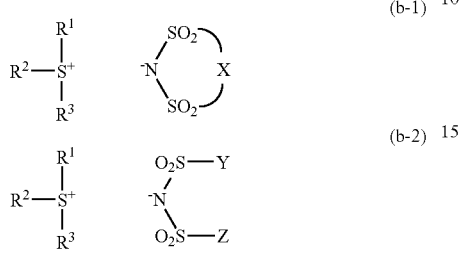

wherein, X represents an alkylene group of 2 to 6 carbon atoms in which at least one hydrogen atom has been substituted with a fluorine atom; Y and Z each represent, independently, an alkyl group of 1 to 10 carbon atoms in which at least one hydrogen atom has been substituted with a fluorine atom; $R^1$ to $R^3$ each represent, independently, an aryl group or an alkyl group, and at least one of $R^1$ to $R^3$ is an aryl group.

9. A photoresist composition according to claim 8, further comprising as said component (B), (b-0) an onium salt that comprises a fluorinated alkylsulfonate ion as an anion.

10. A photoresist composition according to claim 6, further comprising
a nitrogen-containing organic compound.

11. A method for forming a resist pattern, comprising:
applying a photoresist composition that comprises a resin comprising a —$CR^1R^2OH$ group only at a terminal of a principal chain of the resin, wherein $R^1$ and $R^2$ each represent, independently, an alkyl group, halogen atom, or halogenated alkyl group, and at least one of $R^1$ and $R^2$ is an electron attractive group selected from the group consisting of halogen atoms and halogenated alkyl groups to a surface of a substrate;
performing selective exposure through a desired mask pattern; and
performing developing to form a resist pattern.

* * * * *